(12) United States Patent
Liu et al.

(10) Patent No.: US 9,719,175 B2
(45) Date of Patent: Aug. 1, 2017

(54) MULTILAYER STRUCTURED COATINGS FOR CUTTING TOOLS

(71) Applicants: Zhenyu Liu, Greensburg, PA (US); Peter Rudolf Leicht, Latrobe, PA (US); Yixiong Liu, Greensburg, PA (US)

(72) Inventors: Zhenyu Liu, Greensburg, PA (US); Peter Rudolf Leicht, Latrobe, PA (US); Yixiong Liu, Greensburg, PA (US)

(73) Assignee: KENNAMETAL INC., Latrobe, PA (US)

(*) Notice: Subject to any disclaimer, the term of this patent is extended or adjusted under 35 U.S.C. 154(b) by 108 days.

(21) Appl. No.: 14/502,052

(22) Filed: Sep. 30, 2014

(65) Prior Publication Data
US 2016/0090654 A1    Mar. 31, 2016

(51) Int. Cl.
| | |
|---|---|
| *C23C 16/34* | (2006.01) |
| *C23C 28/04* | (2006.01) |
| *C23C 16/40* | (2006.01) |
| *C23C 28/00* | (2006.01) |
| *C23C 16/36* | (2006.01) |
| *C23C 16/56* | (2006.01) |

(52) U.S. Cl.
CPC .......... *C23C 28/044* (2013.01); *C23C 16/34* (2013.01); *C23C 16/36* (2013.01); *C23C 16/403* (2013.01); *C23C 16/56* (2013.01); *C23C 28/042* (2013.01); *C23C 28/42* (2013.01)

(58) Field of Classification Search
USPC .......... 51/307, 309; 428/216, 336, 697, 698, 428/699, 701, 702, 7
See application file for complete search history.

(56) References Cited

U.S. PATENT DOCUMENTS

| | | |
|---|---|---|
| 4,052,530 A | 10/1977 | Fonzi |
| 4,112,148 A | 9/1978 | Fonzi |
| 4,180,400 A | 12/1979 | Smith et al. |
| 4,576,836 A | 3/1986 | Colmet et al. |

(Continued)

FOREIGN PATENT DOCUMENTS

| | | |
|---|---|---|
| CN | 102581324 A | 7/2012 |
| DE | 2736982 A1 | 3/1979 |

(Continued)

OTHER PUBLICATIONS

Bjormander, C. , "CVD Deposition and Characterization of Coloured Al2O3/ZrO2 Multilayers".

(Continued)

*Primary Examiner* — Archene Turner
(74) *Attorney, Agent, or Firm* — Larry R. Meenan

(57) ABSTRACT

Cutting tools are described having coatings which can demonstrate desirable wear resistance and increased cutting lifetimes. A coated cutting tool described herein has a substrate and a coating with a plurality of alternating layers of a first layer of $Al_2O_3$ and a second layer of at least one of $MeAl_2O_3$ and $MeAl_2O_3/MeO_2$ composite, wherein Me is Zr, Hf, Ti or a combination thereof. The coating has a superlattice-like structure.

20 Claims, 6 Drawing Sheets

(56) References Cited

U.S. PATENT DOCUMENTS

| | | | |
|---|---|---|---|
| 4,701,384 A | 10/1987 | Sarin et al. |
| 4,702,970 A | 10/1987 | Sarin et al. |
| 4,745,010 A | 5/1988 | Sarin et al. |
| 4,746,563 A | 5/1988 | Nakano et al. |
| 4,749,629 A | 6/1988 | Sarin et al. |
| 4,751,109 A | 6/1988 | Sarin et al. |
| 4,844,951 A | 7/1989 | Sarin et al. |
| 5,310,607 A | 5/1994 | Schulz et al. |
| 5,447,804 A | 9/1995 | Schulz et al. |
| 5,709,907 A | 1/1998 | Battaglia et al. |
| 5,722,803 A | 3/1998 | Battaglia et al. |
| 5,770,261 A | 6/1998 | Nakamura et al. |
| 5,827,570 A | 10/1998 | Russell |
| 5,861,210 A | 1/1999 | Lenander et al. |
| 5,871,850 A | 2/1999 | Moriguchi et al. |
| 5,879,823 A | 3/1999 | Prizzi et al. |
| 5,923,056 A | 7/1999 | Lee et al. |
| 5,972,495 A | 10/1999 | Ishii et al. |
| 5,985,427 A | 11/1999 | Ueda et al. |
| 6,156,383 A | 12/2000 | Ishii et al. |
| 6,161,990 A | 12/2000 | Oles et al. |
| 6,183,846 B1 | 2/2001 | Moriguchi et al. |
| 6,333,103 B1 | 12/2001 | Ishii et al. |
| 6,426,137 B1 | 7/2002 | Oshika et al. |
| 6,436,519 B2 | 8/2002 | Holzschuh |
| 6,599,062 B1 | 7/2003 | Oles et al. |
| 6,641,939 B1 | 11/2003 | Lee et al. |
| 6,660,371 B1 | 12/2003 | Westphal et al. |
| 6,689,422 B1 | 2/2004 | Warnes et al. |
| 6,713,172 B2 | 3/2004 | Ljungberg et al. |
| 6,726,987 B2 | 4/2004 | Kathrein et al. |
| 6,756,111 B1 | 6/2004 | Okada et al. |
| 6,849,132 B2 | 2/2005 | Warnes et al. |
| 6,869,668 B2 | 3/2005 | Martensson |
| 6,902,764 B2 | 6/2005 | Ljungberg et al. |
| 7,011,867 B2 | 3/2006 | Martensson |
| 7,090,914 B2 | 8/2006 | Yamagata et al. |
| 7,094,447 B2 | 8/2006 | Ruppi |
| 7,163,735 B2 | 1/2007 | Ruppi |
| 7,241,492 B2 | 7/2007 | Kohara et al. |
| 7,273,665 B2 | 9/2007 | Hayahi et al. |
| 7,276,301 B2 | 10/2007 | Tsushima et al. |
| 7,326,461 B2 | 2/2008 | Sottke et al. |
| 7,378,158 B2 | 5/2008 | Richter et al. |
| 7,396,581 B2 | 7/2008 | Ruppi |
| 7,410,707 B2 | 8/2008 | Fukui et al. |
| 7,416,778 B2 | 8/2008 | Westergren et al. |
| 7,442,433 B2 | 10/2008 | Honma et al. |
| 7,498,089 B2 | 3/2009 | Omori et al. |
| 7,531,212 B2 | 5/2009 | Kohara et al. |
| 7,531,213 B2 | 5/2009 | Björmander |
| 7,597,511 B2 | 10/2009 | Tomita et al. |
| 7,597,951 B2 | 10/2009 | Bjormander et al. |
| 7,597,970 B2 | 10/2009 | Fukano et al. |
| 7,691,496 B2 | 4/2010 | Park et al. |
| 7,803,464 B2 | 9/2010 | Okada et al. |
| 7,820,310 B2 | 10/2010 | Bjormander |
| 7,901,788 B2 | 3/2011 | Warnes et al. |
| 7,906,230 B2 | 3/2011 | Watanabe et al. |
| 7,923,101 B2 | 4/2011 | Ruppi |
| 7,928,028 B2 | 4/2011 | Nawa et al. |
| 7,939,181 B2 | 5/2011 | Ramm et al. |
| 7,967,533 B2 | 6/2011 | Omori et al. |
| 7,968,182 B2 | 6/2011 | Trinh et al. |
| 7,972,714 B2 | 7/2011 | Okada et al. |
| 8,003,234 B2 | 8/2011 | Omori et al. |
| 8,012,611 B2 | 9/2011 | Okada et al. |
| 8,025,991 B2 | 9/2011 | Schier |
| 8,071,211 B2 | 12/2011 | Koike et al. |
| 8,080,312 B2 | 12/2011 | McNerny et al. |
| 8,080,323 B2 | 12/2011 | Ban et al. |
| 8,097,332 B2 | 1/2012 | Omori et al. |
| 8,119,226 B2 | 2/2012 | Reineck et al. |
| 8,119,227 B2 * | 2/2012 | Reineck ............... C23C 30/005 428/216 |
| 8,129,040 B2 | 3/2012 | Quinto et al. |
| 8,152,971 B2 | 4/2012 | Quinto et al. |
| 8,221,838 B2 | 7/2012 | Gates, Jr. et al. |
| 8,288,019 B2 | 10/2012 | Nagano et al. |
| 2001/0006724 A1 | 7/2001 | Holzschuh |
| 2002/0081447 A1 | 6/2002 | Movchan et al. |
| 2002/0114945 A1 | 8/2002 | Greenberg et al. |
| 2002/0119017 A1 | 8/2002 | Gates, Jr. et al. |
| 2004/0224159 A1 | 11/2004 | Oshika et al. |
| 2004/0241490 A1 | 12/2004 | Finley |
| 2005/0260454 A1 | 11/2005 | Fang et al. |
| 2006/0029813 A1 | 2/2006 | Kutilek et al. |
| 2006/0292390 A1 | 12/2006 | Kassner et al. |
| 2007/0122947 A1 | 5/2007 | Sakurai et al. |
| 2007/0212895 A1 | 9/2007 | Chua et al. |
| 2007/0289280 A1 | 12/2007 | Marquardt |
| 2008/0196318 A1 | 8/2008 | Bost |
| 2010/0044969 A1 | 2/2010 | Fischer et al. |
| 2010/0166512 A1 | 7/2010 | Tanibuchi |
| 2010/0303566 A1 | 12/2010 | Fang et al. |
| 2011/0108887 A1 | 5/2011 | Fareed et al. |
| 2012/0003452 A1 | 1/2012 | Tomita et al. |
| 2012/0141917 A1 | 6/2012 | Kang et al. |
| 2013/0307092 A1 | 11/2013 | Ohmi |
| 2014/0287229 A1* | 9/2014 | Wendt .................... C23C 16/40 428/336 |

FOREIGN PATENT DOCUMENTS

| | | |
|---|---|---|
| EP | 0786536 B1 | 5/2003 |
| EP | 1655387 B1 | 5/2008 |
| JP | 56152962 A | 11/1981 |
| JP | 57158372 A | 9/1982 |
| JP | 5921586 A | 2/1984 |
| JP | 5985860 A | 5/1984 |
| JP | 0516031 A | 1/1993 |
| JP | 4195518 B2 | 7/1998 |
| JP | 4019244 B2 | 6/2002 |
| JP | 2003039207 A | 2/2003 |
| JP | 2005205516 A | 8/2005 |
| JP | 2006219739 A | 8/2006 |
| JP | 4645983 B2 | 10/2006 |
| JP | 2006289556 A | 10/2006 |
| JP | 2008019489 A | 1/2008 |
| JP | 2008019498 A | 1/2008 |
| JP | 4822120 B2 | 2/2008 |
| JP | 5019255 B2 | 1/2009 |
| JP | 5099490 B2 | 4/2009 |
| JP | 5099500 B2 | 7/2009 |
| JP | 2011057529 A | 3/2011 |
| JP | 2011127165 A | 6/2011 |
| JP | 2011184295 A | 9/2011 |
| JP | 2012143825 A | 8/2012 |
| KR | 1020060102658 A | 9/2006 |
| WO | 02/077312 A2 | 10/2002 |

OTHER PUBLICATIONS

Hochauer, et al., "Carbon doped α-Al2O3 coatings grown by chemical vapor deposition".

Hochauer, H. et al., "Titanium doped CVD alumina coatings".

Hochauer, D., et al. "Titanium doped CVD alumina coatings." Surface & Coatings Technology 203.3-4 (2008): 350-356., 2008, 350-356.

Martensson, Per , "Influence of the concentration of ZrCl4 on texture, morphology and growth rate of CVD grown α-Al2O3 coatings deposited by the AlCl3/ZrCl4/H2/CO2/H2S process", Mar. 15, 2006.

Ruhle, Manfred , "Microcrack and Transformation Toughening of Zirconia-Containing Alumina".

Russell, W. C. et al., "Wear Characteristics and Performance of Composite Alumina-Zirconia CVD Coatings".

X. Feng et al., "Converting Ceria Polyhedral Nanoparticles into Single-Crystal Nanospheres", SCIENCE Magazine, vol. 312, Jun. 9, 2006, pp. 1504-1508.

(56) References Cited

OTHER PUBLICATIONS

Z. Yu et al., "Atomic-resolution observation of Hf-doped alumina grain boundaries", SciVerse ScienceDirect, Scripta Materialia 68 (2013) pp. 703-706.

N. Shibata et al., "Atomic-scale imaging of individual dopant atoms in a buried interface", Nature Materials, vol. 8, 2009, pp. 654-658.

J. P. Buban et al., "Grain Boundary Strengthening in Alumina by Rare Earth Impurities", SCIENCE Magazine, vol. 311, Jan. 13, 2006, pp. 212-215.

Z. Li et al., "Nanodomain formation and distribution in Gd-doped ceria", SciVerse ScienceDirect, Materials Research Bulletin 47 (2012) pp. 763-767.

W. C. Russell et al., "Wear Characteristics and Performance of Composite Alumina-Zirconia CVD Coatings*", Int. J. of Refractory Metals & Hard Materials 14 (1996) pp. 51-58.

S. Taylor, "Grain Boundary Structure and Solute Segregation in Titanium-Doped Sapphire Bicrystals", Disseeration, University of California, Berkley, Spring 2002, pp. 1-222.

Kathrein et al., "Doped CVD Al2O3 Coatings for High Performance Cutting Tools", Surface & Coatings Technology 163-164 (2001), pp. 181-188.

Moltrecht, "Machine Shop Practice", Industrial Press Inc., New York, New York (1981), pp. 199-204.

ASTE Tool Engineers Handbook; McGraw Hill Book Co., New York, New York (1949), pp. 302-315.

* cited by examiner

1

MULTILAYER STRUCTURED COATINGS FOR CUTTING TOOLS

FIELD

The present invention relates to coatings for cutting tools and, in particular, to coatings deposited by chemical vapor deposition (CVD).

BACKGROUND

Cutting tools, including cemented carbide cutting tools, have been used in both coated and uncoated conditions for machining various metals and alloys. In order to increase cutting tool wear resistance, performance and lifetime, one or more layers of refractory material have been applied to cutting tool surfaces. TiC, TiCN, TiN and/or $Al_2O_3$, for example, have been applied to cemented carbide substrates by CVD and by physical vapor deposition (PVD). While effective in inhibiting wear and extending tool lifetime in a variety of applications, refractory coatings based on single or multi-layer constructions of the foregoing refractory materials naturally have performance limits, thereby calling for the development of new coatings with improved properties.

SUMMARY

In one aspect, cutting tools are described having coatings adhered thereto which, in some embodiments, can demonstrate desirable wear resistance and increased cutting lifetimes. A coated cutting tool described herein comprises a substrate and a coating comprising a plurality of alternating layers comprising a first layer of $Al_2O_3$ and a second layer of at least one of $MeAl_2O_3$ and $MeAl_2O_3/MeO_2$ composite, wherein Me is Zr, Hf or Ti or a combination thereof.

Methods of making coated cutting tools are also provided. A method of making a coated cutting tool described herein comprises providing a cutting tool substrate, and depositing over a surface of the cutting tool substrate by CVD a coating comprising a plurality of alternating layers comprising a first layer of $Al_2O_3$ and a second layer of at least one of $MeAl_2O_3$ and $MeAl_2O_3/MeO_2$ composite, wherein Me is Zr, Hf, Ti or a combination thereof. The plurality of alternating layer may begin with the first or second layer nearest the substrate.

These and other embodiments are described in greater detail in the detailed description which follows.

DETAILED DESCRIPTION

Embodiments described herein can be understood more readily by reference to the following detailed description and examples and their previous and following descriptions. Elements, apparatus and methods described herein, however, are not limited to the specific embodiments presented in the detailed description and examples. It should be recognized that these embodiments are merely illustrative of the principles of the present invention. Numerous modifications and adaptations will be readily apparent to those of skill in the art without departing from the spirit and scope of the invention.

I. Coated Cutting Tools

Figure 1:
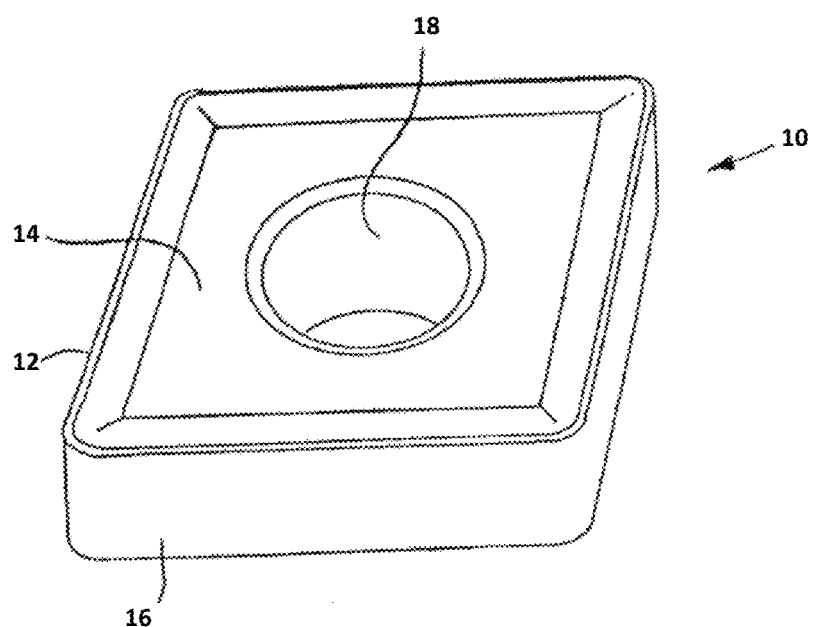
FIG. 1 illustrates a coated cutting tool according to one embodiment described herein.

In one aspect, cutting tools are described having coatings adhered thereto which, in some embodiments, can demonstrate desirable wear resistance and increased cutting lifetimes. Referring now to FIG. 1, a coated cutting tool 10 described herein may comprise a cutting edge 12, a rake face 14, a flank face 16 and a mounting hole 18. The insert 10 may be a variety of geometries and configurations, e.g. with or without chipbreakers, mounting hole or positive or negative rake angle.

Figure 2:
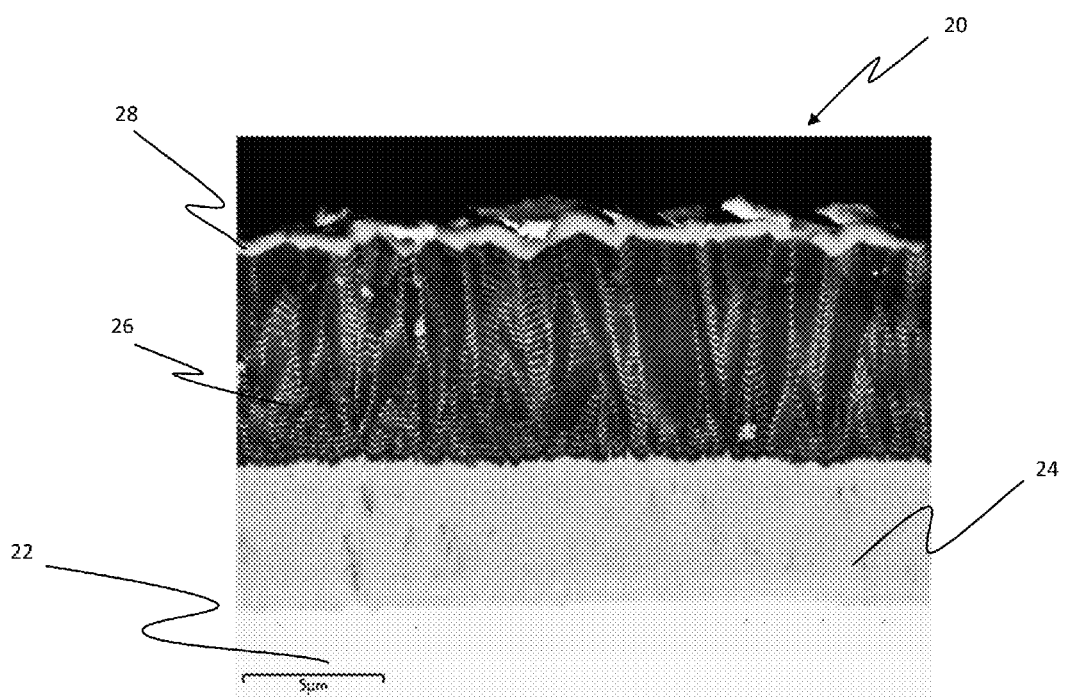
FIG. 2 is a cross-sectional scanning electron microcopy (SEM) image of a coated cutting insert according to one embodiment described herein.

Referring now to FIG. 2, one embodiment described herein provides a cutting insert 20. The cutting insert 20 has a substrate 22 and a coating adhered to the substrate 22, the coating has a multilayer structure comprising an optional inner layer 24 and an optional bonding layer between the inner layer 24, a superlattice-like coating 26 and outmost coating layer 28. The super-lattice like coating comprises repeating coating layers designated A and B wherein A and B represent a periodicity of dopant-containing $Al_2O_3$ (B) and un-doped $Al_2O_3$ (A) sequences. Alternatively, the periodicity may include dopant-containing $Al_2O_3$ (B) and low level doped $Al_2O_3$ (A). Dopants may include Ti, Zr, Hf or a combination thereof. The alternating doping layer and un-doped layer or different doping level layers can induce the formation of superlattice-like coating structures.

In one embodiment of the present invention, the cutting insert 20 comprises a substrate 22. Substrates of coated cutting tools can comprise any material not inconsistent with the objectives of the present invention. In some embodiments, a substrate comprises cemented carbide, PCD, PcBN, ceramic, cermet or steel.

A cemented carbide substrate can comprise tungsten carbide (WC). WC can be present in a substrate in an amount of at least about 70 weight percent. In some embodiments, WC is present in a substrate in an amount of at least about 80 weight percent or in an amount of at least about 85 weight percent. Additionally, metallic binder of a cemented carbide substrate can comprise cobalt or cobalt alloy. Cobalt, for example, can be present in a cemented carbide substrate in an amount ranging from about 3 weight percent to about 15 weight percent. In some embodiments, cobalt is present in a cemented carbide substrate in an amount of 5-12 weight percent or 6-10 weight percent. Further, a cemented carbide substrate may exhibit a zone of binder enrichment beginning at and extending inwardly from the surface of the substrate.

Cemented carbide substrates can also comprise one or more additives such as, for example, one or more of the following elements and/or their compounds: titanium, niobium, vanadium, tantalum, chromium, zirconium and/or hafnium. In some embodiments, titanium, niobium, vanadium, tantalum, chromium, zirconium and/or hafnium form solid solution carbides with WC in the substrate. The substrate, in some embodiments, comprises one or more solid solution carbides in an amount ranging from about 0.1 weight percent to about 5 weight percent. Additionally, a cemented carbide substrate can comprise nitrogen.

In some embodiments, a substrate of a coated cutting tool described herein comprises one or more cutting edges formed at the juncture of a rake face and flank faces of the substrate. In some embodiments, a substrate of a coated cutting tool is a drill bit, end mill, saw blade or other cutting apparatus.

A coating adhered to the substrate may comprise a bonding layer between the inner layer 24 and the superlattice-like layer 26. A bonding layer comprises TiCN and TiAlOC. In some embodiments, a bonding layer further comprises TiOCN. TiCN, TiAlOC and TiOCN can be provided as sublayers of the bonding layer. Further, a bonding layer of structural unit generally has a thickness less than 5 μm. In some embodiments, a bonding layer has a thickness selected from Table I.

TABLE I

| Bonding layer thickness (nm) Bonding Layer Thickness (nm) |
|---|
| 10-950 |
| 5-500 |
| 5-200 |
| 10-100 |

When one or more sublayers of TiCN, TiAlOC and/or TiOCN constitute a bonding layer, the sublayers can each have a thickness of 5-500 nm. In some other embodiments, a diffusion barrier layer comprising nitride, TiN, ZrN and HfN and/or their combination can adhere to the substrate directly. The thickness of the diffusion barrier can be less than 2 μm.

Further, a coating described herein can also comprise one or more outer layers over the structural units. An outer layer, in some embodiments, comprises one or more metallic elements selected from the group consisting of aluminum and metallic elements of Groups IVB, VB and VIB of the Periodic Table and one or more non-metallic elements selected from the group consisting of non-metallic elements of Groups IIIA, IVA, VA and VIA of the Periodic Table. In some embodiments, one or more outer layers deposited over the structural units comprise a nitride, carbonitride, oxide or boride of one or more metallic elements selected from the group consisting of aluminum and metallic elements of Groups IVB, VB and VIB of the Periodic Table. For example, one or more outer layers are selected from the group consisting of TiN, TiCN and TiOCN. Outer layers of coatings described herein can have any thickness not inconsistent with the objectives of the present invention. An outer layer of a coating, in some embodiments, can have a thickness ranging from 0.5 μm to 5 μm. With all components accounted for, a coating described herein can have a thickness up to 25 μm. A coating, for example, can have a total thickness of 2-15 μm or 5-20 μm.

Figure 3:
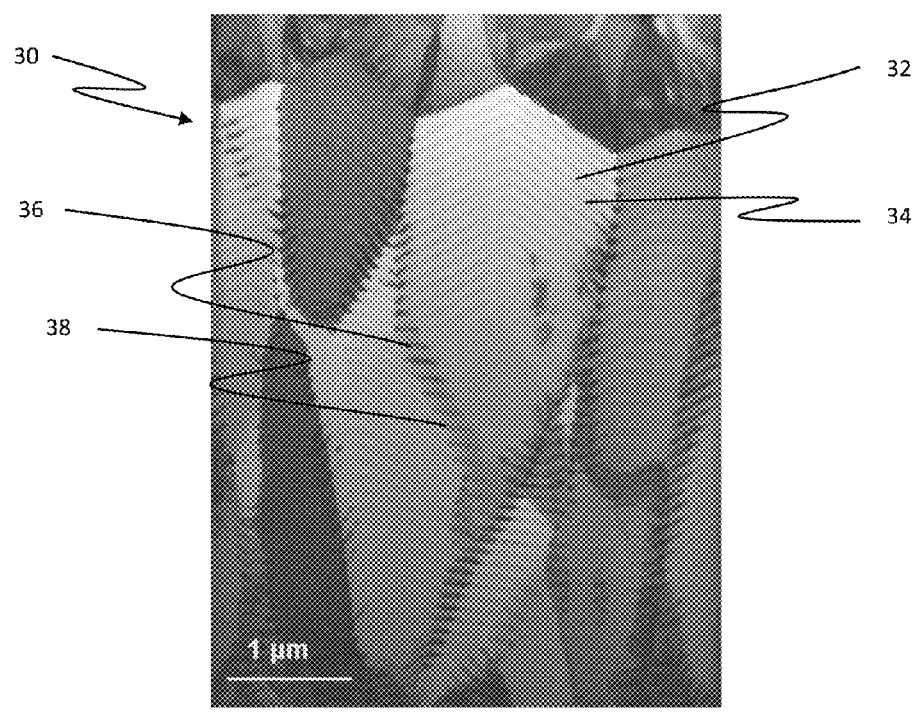
FIG. 3 is a magnified, cross-sectional scanning transmission electron microcopy (STEM) bright field (BF) image of a coated cutting insert according to one embodiment described herein.

FIG. 3 is a STEM-BF image of a cross-section of a coating 30 according to one embodiment of the present invention. The alternating A/B layers 32, 34 can be clearly seen in the image. An A-layer 32, with darker contrast in the image, represents a doped layer while a B-layer 34, with lighter contrast in the image, represents a layer having lesser or no doping. Alternating dark regions 36 and light regions 38 are visible at grain boundaries. The dark areas 36 indicate intergranular $ZrO_2$ deposits. Numerous $ZrO_2$ deposits distributed along the grain boundaries are visible in the image although dark area 36 is the only deposit specifically called out in FIG. 3.

Figure 4:
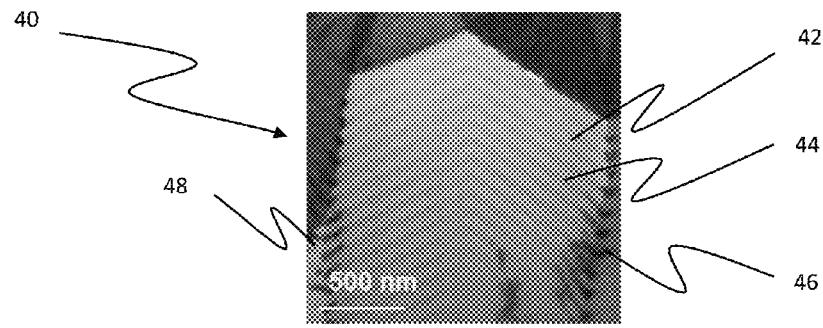
FIG. 4 is the magnified, cross-sectional STEM BF image of a coated cutting insert according to one embodiment described herein from FIG. 3.

FIG. 4 is also a STEM-BF (Bright Field) image of a cross-section of a coating 40 according to one embodiment of the present invention. The alternating A/B layers 42, 44 can be clearly seen in the image. An A-layer 42 represents a layer having lesser or no doping while a B-layer represents a doped layer. Alternating dark regions 46 and light regions 48 are visible at grain boundaries. The dark areas 46 indicate intergranular $ZrO_2$ deposits.

Figure 5:
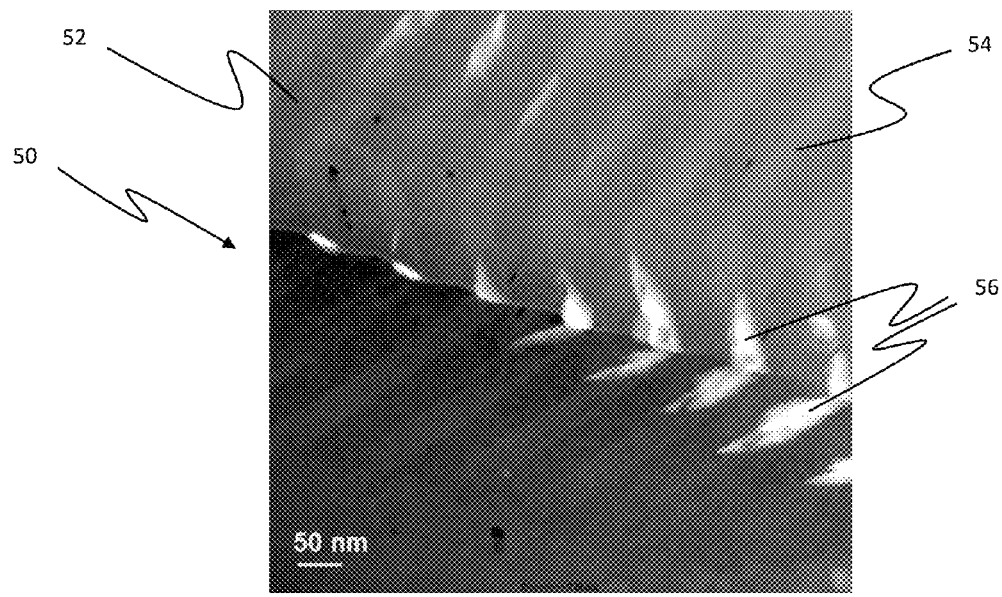
FIG. 5 is a magnified, cross-sectional STEM High Angle Annual Dark Field (HAADF) image of a coated cutting insert according to one embodiment described herein.

FIG. 5 is a STEM-HAADF (High Angle Annular Dark Field) image of a cross section of a coating 50. Dark layers 52 in the HAADF image indicate lack of dopant. Lighter layers 54 indicate higher levels of dopant. The light areas 56 indicate intergranular $ZrO_2$ deposits. FIGS. 3-5 show a unique chevron pattern present within the individual coating grains.

In one embodiment the present invention has an alternative doped alumina layer and un-doped alumina layer coating scheme or different doping levels with alternative high level and low level or different dopant multi-periodicity layers. It will be apparent to one skilled in the art that the periodicity pertains to high level and low level doping with Zr, Hf or Ti and the low level doped layers may have no dopant or a lesser amount of dopant than the high level dopant layers. As used herein the "low doped layer" and "high doped layer" refer to the alternating alumina containing layers where the high doped layer contains more dopant than the low doped layer and the low doped layer less dopant than the high doped layer or no dopant at all. The coating scheme includes CVD coating layers involving alternating high doped layers and low doped layers having pre-defined layer thickness and/or grain size. The alternative high doped layer and low doped layer along with nano-scale layer thickness induces the formation of superlattice-like structures. The multilayer coating scheme layer thickness and/or crystal grain size can be tuned in the range from 0.5-20 microns by adjusting the process duration designed for the different coating layers and dopant and alumina source ratios. The individual high doped and low doped layers may both be in the range of 0.050-0.2 microns. Different phases of alpha and kappa alumina may be introduced into the coating scheme by alternate the bonding and interlayer structures. The coating procedure provides great opportunity to control the doping level with well-designed dopant introduction. The alumina dopants can be $ZrCl_4$, $HfCl_4$ or $TiCl_4$ generated by reaction between HCl gas with metal species of Ti, Zr or Hf mixtures at 360–450° C. The innovative coating procedures also provide great opportunity to manipulate the coating structure. Doped grain size can be controlled, especially, zirconium doped alumina ($ZrAl_2O_3$), with $ZrO_2$ formation in the coating system. This is due to the competition and selectivity between $Al_2O_3$, $ZrO_2$, doped alumina ($ZrAl_2O_3$) and the second phase $ZrO_2$ formation.

Figure 6:
FIG. 6 is a magnified, cross-sectional STEM HAADF image of a coated cutting insert treated with a focused ion beam according to one embodiment described herein.

FIG. 6 is a cross section of a coating sample 60 according to one embodiment of the present invention. The sample was prepared by treating with a focused ion beam. Locations 62, 64 and 66 were analyzed using energy dispersive spectroscopy (EDS) in a STEM. Table II contains the quantitative data resulting from the EDS spectra for each of the locations 62, 64, 66.

TABLE II

Quantitative EDS of a coating sample 60

| Location | Element | Weight % | Atomic % |
|---|---|---|---|
| 62 | O | 39.92 | 58.67 |
|    | Al | 42.1 | 36.69 |
|    | Zr | 17.96 | 4.63 |
| 64 | O | 39.76 | 52.98 |
|    | Al | 59.19 | 46.76 |
|    | Zr | 1.03 | 0.24 |
| 66 | O | 46.24 | 59.20 |
|    | Al | 53.75 | 40.79 |
|    | Zr | 0.00 | 0.00 |

Location 62 is a composite portion of the coating containing high levels of Zr (17.96 weight %) due to the formation of an intragrain of $ZrO_2$. Location 64 is within a doped layer of the coating sample 60. Location 64 contains 1.03 weight % of Zr and 59.19 weight % of Al. Location 66 is within an un-doped layer of the coating sample 60. Location 66 contains no Zr and 53.75 weight % of Al.

A thin TiCN/TiN-top layer may be deposited for wear indication and optical appearance. The TiCN/TiN top layer can be also functioned as sacrificial layer for post coat wet-blasting or dry-blasting to modify the stress situation in the coating layers. Other outer layer systems, such as ZrCN, HfCN and TiOCN can be applied to coating scheme as well.

The coating scheme layer thickness can be tuned in the range from 0.05-20 microns by adjusting the process duration designed for the different coating layers and dopant and alumina source ratios.

Coatings of cutting tools described herein can be subjected to post-coat treatments. Coatings, for example, can be blasted with various wet and/or dry particle compositions. Post coat blasting can be administered in any desired manner. In some embodiments, post coat blasting comprises shot blasting or pressure blasting. Pressure blasting can be administered in a variety of forms including compressed air blasting, wet compressed air blasting, pressurized liquid blasting, wet blasting, pressurized liquid blasting and steam blasting. Wet blasting, for example, is accomplished using a slurry of inorganic and/or ceramic particles, such as alumina, and water. The alumina particle slurry can be pneumatically projected at a surface of the coated cutting tool body to impinge on the surface of the coating. The alumina particles can generally range in size between about 20 µm and about 100 µm.

Blasting parameters include pressure, angle of impingement, distance to the part surface and duration. In some embodiments, angle of impingement can range from about 5 degrees to about 90 degrees, i.e., the particles impinge the coating surface at an angle ranging from about 5 degrees to about 90 degrees. Suitable pressures can range from 30-55 pounds per square inch (psi) at a distance to the coated surface of 1-6 inches. Further, duration of the blasting can generally range from 1-10 seconds or longer. Blasting can be generally administered over the surface area of the coating or can be applied to select locations such as in a workpiece contact area of the cutting tool. A workpiece contact area can be a honed region of the cutting tool.

In other embodiments, a coating is subjected to a polishing post-coat treatment. Polishing can be administered with paste of appropriate diamond or ceramic grit size. Grit size of the paste, in some embodiments, ranges from 1 µm to 10 µm. In one embodiment, a 5-10 µm diamond grit paste is used to polish the coating. Further, grit paste can be applied to the CVD coating by any apparatus not inconsistent with the objectives of the present invention, such as brushes. In one embodiment, for example, a flat brush is used to apply grit paste to the CVD coating in a workpiece contact area of the cutting tool.

A coating described herein can be blasted or polished for a time period sufficient to achieve a desired surface roughness ($R_a$) and/or other parameters such as reducing residual tensile stress in the coating. In some embodiments, a coating subjected to post-coat treatment has a surface roughness ($R_a$) selected from Table III.

TABLE III

Post-Coat Surface Roughness ($R_a$)
Coating Surface Roughness ($R_a$) - nm

≤500
≤250
<200
10-250
50-175
25-150

Coating surface roughness can be determined by optical profilometry using WYKO® NT-Series Optical Profilers commercially available from Veeco Instruments, Inc. of Plainview, N.Y.

Further, a post-coat treatment, in some embodiments, does not remove one or more outer layers of the coating. In some embodiments, for example, a post-coat treatment does not remove an outer layer of TiN, TiCN and/or TiOCN. Alternatively, a post-coat treatment can remove or partially remove one or more outer layers, such as TiN, TiCN and TiOCN.

II. Methods of Making Coated Cutting Tools

Methods of making coated cutting tools are also provided. A method of making a coated cutting tool described herein comprises providing a cutting tool substrate and depositing a coating by CVD over a surface of the cutting tool substrate.

Turning now to specific steps, a method described herein comprises providing a substrate. A substrate can comprise any substrate recited in Section I hereinabove. In some embodiments, for example, a substrate is cemented carbide, such as cemented tungsten carbide as described in Section I. Moreover, coatings deposited according to a methods described herein can have any construction and/or properties recited in Section I.

In some embodiments, one or more base layers of the coating reside between the substrate and the alumina containing layers. A base layer can comprise one or more metallic elements selected from the group consisting of aluminum and metallic elements of Groups IVB, VB and VIB of the Periodic Table and one or more non-metallic elements of Groups IIIA, IVA, VA and VIA of the Periodic Table. A base layer, for example, can be selected from the group consisting of titanium nitride (TiN), titanium carbonitride (TiCN) and titanium oxycarbonitride (TiOCN). In some embodiments, a multilayer arrangement is present comprising TiN and TiCN. General CVD deposition parameters for various base layers are provided in Table IV.

TABLE IV

CVD Parameters for base layer deposition

| Base Layer Composition | Gas Mixture | Temperature (° C.) | Pressure (torr) | Duration (minutes) |
|---|---|---|---|---|
| TiN | $H_2$, $N_2$, $TiCl_4$ | 800-900 | 60-300 | 20-120 |
| TiCN(MT) | $H_2$, $N_2$, $TiCl_4$, $CH_3CN$ | 750-900 | 30-300 | 60-300 |
| TiCN(HT) | $H_2$, $N_2$, $TiCl_4$, $CH_4$ | 900-1050 | 30-300 | 30-200 |
| TiOCN | $H_2$, $N_2$, $TiCl_4$, $CH_4$, CO | 900-1050 | 60-500 | 30-300 |

Additionally, methods described herein can further comprise depositing one or more outer layers over the alumina containing layer. An outer layer, in some embodiments, comprises one or more metallic elements selected from the group consisting of aluminum and metallic elements of Groups IVB, VB and VIB of the Periodic Table and one or more non-metallic elements selected from the group consisting of non-metallic elements of Groups IIIA, IVA, VA and VIA of the Periodic Table. In one embodiment, for example, an outer layer of TiCN and/or TiOCN is deposited with reference to CVD parameters set forth in Table IV. Coatings deposited according to methods described herein can have an architecture provided in Table IV above.

The alumina containing layers can be formed at the following example conditions: Temp: 800~1500° C.; Pressure: 30~500 torr; gas mixture of $AlCl_3$+$H_2$+$CO_2$+$H_2S$ (optional)+HCl (optional) for 3~600 minutes. The doped alumina can be formed at the following example conditions: Temp: 800~1500° C.; Pressure: 30~500 torr; gas mixture of $AlCl_3$+($TiCl_4$ or $ZrCl_4$ or $HfCl_4$ or a combination thereof)+$H_2$+$CO_2$+$H_2S$ (optional)+HCl (optional) for 1~600 minutes and with different dopant introduction levels. CVD parameters pertaining to the alumina containing layers are provided in Table V.

TABLE V

CVD Parameters for base layer deposition

| Base Layer Composition | Gas Mixture | Temperature (° C.) | Pressure (torr) | Duration (minutes) |
|---|---|---|---|---|
| $Al_2O_3$ | $AlCl_3$ + $H_2$ + $CO_2$ + $H_2S$ (optional) + HCl (optional) | 800-1500 | 30-500 | 3-600 |
| $MeAl_2O_3$/$MeO_2$ | [($AlCl_3$ + $TiCl_4$ or $ZrCl_4$ or $HfCl_4$) or (their combination)] + $H_2$ + $CO_2$ + $H_2S$ (optional) + HCl (optional) | 800-1500 | 30-500 | 1-600 |

Figure 7:
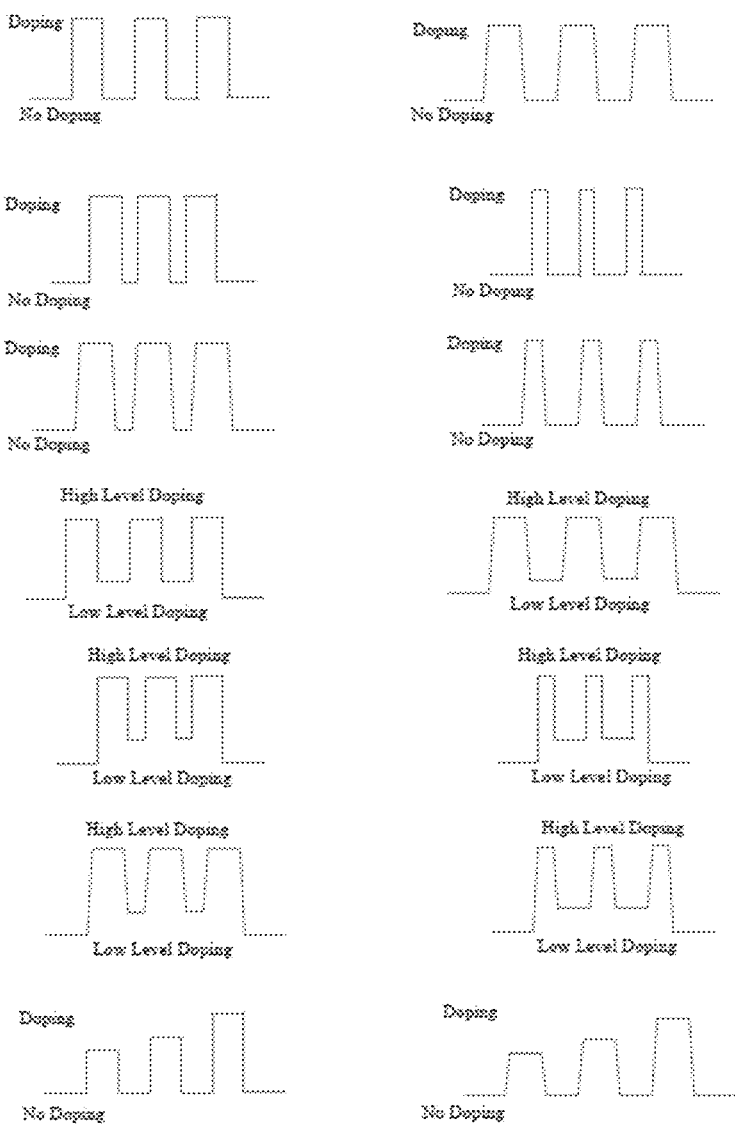
FIG. 7 is a schematic of various doping processes according embodiments described herein.

In one embodiment of the present invention doping level is altered by controlling the ratio of Al/Me via the HCl gas flow introduced into the metal chloride generators. In another embodiment of the present invention, dopant introduction time is varied during the coating deposition. As well, it is possible to realize multi-periodicity of dopant-containing alumina and un-doped alumina sequences or different doping level sequences with different layer thickness ratios. Dopant introduction may be abrupt, ramped, variable, constant, high and low. Several embodiments of doping variations are shown in FIG. 7.

Further, the deposited coatings can be subjected to post-coat treatment(s) such as post-coat blasting or polishing as described in Section I hereinabove. Post coat blasting, in some embodiments, can change moderate tensile stress of the coating to moderate compressive stress or increase compressive stress in the as-deposited coating.

These and other embodiments are illustrated in the following non-limiting examples.

III. Examples-Coated Cutting Tool

A coated cutting tool described herein was produced by placing a cemented tungsten carbide (WC—Co) cutting insert substrate [ANSI standard geometry CNMG432RN] into an axial flow hot-wall CVD reactor. The cutting insert comprised about 6 wt. % cobalt binder with the balance WC grains of size 1 to 5 μm. A coating having an architecture provided in Table VI was deposited on the cemented WC cutting insert according to the CVD process parameters provided in Tables IV-V. $Al_2O_3$—$ZrAl_2O_3$/$ZrO_2$ denotes a two layer system of α-$Al_2O_3$ and $ZrAl_2O_3$/$ZrO_2$. Samples A-D included the two layer system of α-$Al_2O_3$ and $ZrAl_2O_3$—$ZrO_2$. Sample E was included as comparative example and included only an α-$Al_2O_3$ outermost layer. All samples were initially coated with an outermost layers of TiCN/TiN. These layers were post-coat treated with a heavy wet blast of alumina particle slurry to remove the TiCN/TiN layers.

TABLE VI

CVD Coating Architecture

| Sample | Substrate | CVD Coating Architecture | n |
|---|---|---|---|
| A | WC—Co | TiN*-TiCN(MT)-TiCN/TiOCN/[$Al_2O_3$/$ZrAl_2O_3$—$ZrO_2$]$_n$ | 1 |
| B | WC—Co | TiN*-TiCN(MT)-TiCN/TiOCN/[$Al_2O_3$/$ZrAl_2O_3$—$ZrO_2$]$_n$ | 26 |
| C | WC—Co | TiN*-TiCN(MT)-TiCN/TiOCN/[$Al_2O_3$/$ZrAl_2O_3$—$ZrO_2$]$_n$ | 40 |
| D | WC—Co | TiN*-TiCN(MT)-TiCN/TiOCN/[$Al_2O_3$/$ZrAl_2O_3$—$ZrO_2$]$_n$ | 40 |
| E | WC—Co | TiN*-TiCN(MT)-TiCN/TiOCN/$Al_2O_3$ | — |

*Innermost layer adjacent to the substrate as a diffusion barrier.

The resulting multilayered coating demonstrated the properties provided in Table VII.

Deposition times were modified to produce the different layer thickness in A-D.

TABLE VII

Properties of CVD Coatings

| EXAMPLE | A (1X) | B (26X) | C (40X) | D (40X) | E (—) |
|---|---|---|---|---|---|
| TiN | 0.4 | 0.4 | 0.5 | 0.3 | 0.5 |
| MT-TiCN | 7.9 | 6.8 | 8.8 | 10.0 | 9.5 |
| HT-TiCN/TiOCN | 1.0 | 0.9 | 1.0 | 1.1 | 0.9 |
| $[Al_2O_3/ZrAl_2O_3\text{—}ZrO_2]_n$ | 7.2 | 8.8 | 8.1 | 10.9 | 7.7 |
| Total | 16.2 | 16.9 | 18.3 | 22.3 | 18.5 |
| Zr/Al ratio* | 0.625 | 0.442 | 0.625 | 0.442 | — |
| ZrAl2O3 (μm) | 7.2 | 0.17 | 0.08 | 0.10 | — |

IV. Metal Cutting Testing

Coated cutting inserts (A-D) and comparative coating insert (E) were subjected to continuous turning testing according to the parameters below. Two reps were performed to provide a mean tool life.
Workpiece—1045 Steel (C 45 DIN)
Speed—1000 sfm
Feed Rate—304.8 m/min
Depth of Cut—0.08 mm
Lead Angle: −5°
End of Life was registered by one or more failure modes of:
Uniform Wear (UW) of 0.012 inches
Max Wear (MW) of 0.012 inches
Nose Wear (NW) of 0.012 inches
Depth of Cut Notch Wear (DOCN) of 0.012 inches
Trailing Edge Wear (TW) of 0.012 inches
Three cutting inserts were tested for each coating architecture (1-4) providing repetition 1-3 data as well as mean cutting lifetime. The results of the continuous turning testing are provided in Table VIII.

TABLE VIII

Continuous Turning Testing Results

| Coated Cutting Insert | Repetition 1 Lifetime (minutes) | Repetition 2 Lifetime (minutes) | Mean Cutting Lifetime (minutes) |
|---|---|---|---|
| A | 5.6 | 8.5 | 7.1 |
| B | 14.7 | 15.0 | 14.9 |
| C | 14.0 | 13.7 | 13.9 |
| D | 13.2 | 13.8 | 13.5 |
| E* | 11.8 | 12.2 | 12.0 |

*Comparative Insert

As provided in Table VIII, coated cutting inserts B-D having a multilayer structure of alternating doped and un-doped layers outlasted insert A with only one un-doped and doped layer and insert E having a continuous α-Al$_2$O$_3$ outer layer.

Various embodiments of the invention have been described in fulfillment of the various objects of the invention. It should be recognized that these embodiments are merely illustrative of the principles of the present invention. Numerous modifications and adaptations thereof will be readily apparent to those skilled in the art without departing from the spirit and scope of the invention.

That which is claimed is:

1. A coated cutting tool comprising:
a substrate; and
a coating comprising a plurality of alternating layers comprising a first layer of Al$_2$O$_3$ and a second layer of MeAl$_2$O$_3$/MeO$_2$ composite;
wherein Me is Zr, Hf, Ti or a combination thereof and MeO$_2$ deposits are located within coating grain boundaries.

2. The coated cutting tool of claim 1, wherein the first layer or second layer is 0.05-0.5 microns thick.

3. The coated cutting tool of claim 1, wherein the first layer and the second layer are each 0.05-0.5 microns thick.

4. The coated cutting tool of claim 1, wherein the first layer and the second layer are each less than or equal to 0.015 micron.

5. The coated cutting tool of claim 1, the first layer comprises α-Al$_2$O$_3$, κ-Al$_2$O$_3$ or a combination thereof.

6. The coated cutting tool of claim 1, wherein the second layer is nearer the substrate than the first layer.

7. The coated cutting tool of claim 1, wherein the first layer is nearer the substrate than the second layer.

8. The coated cutting tool of claim 1, wherein the alternation of the first layer and second layer induces formation of a superlattice-like structure within individual grains of the coating.

9. The coated cutting tool of claim 3, wherein an intervening layer between the substrate and the first layer comprises one or more metallic elements selected from the group consisting of aluminum and metallic elements of Groups IVB, VB and VIB of the Periodic Table and one or more non-metallic elements of Groups IIIA, IVA, VA and VIA of the Periodic Table.

10. The coated cutting tool of claim 1, wherein the coating further comprises a base layer adjacent to the substrate surface.

11. The coated cutting tool of claim 8 wherein the alternating coating layers have a chevron shape within a grain.

12. The coated cutting tool of claim 8, wherein the base layer comprises at least one of TiN, MT-TiCN and TiOCN.

13. The coated cutting tool of claim 1, wherein the coating further comprises an outermost layer comprising one or more metallic elements selected from the group consisting of aluminum and metallic elements of Groups IVB, VB and VIB of the Periodic Table and one or more non-metallic elements of Groups IIIA, IVA, VA and VIA of the Periodic Table.

14. The coated cutting tool of claim 1, wherein the Me is present in weight % and the weight % varies between two or more second layers.

15. The coated cutting tool of claim 1, wherein the Me is introduced and removed from a second layer in a gradient fashion.

16. The coated cutting tool of claim 1, wherein the MeO$_2$ deposits exhibit periodic spacing along the grain boundaries.

17. The coated cutting tool in claim 1, wherein the MeO$_2$ deposits are separated by the first layers of Al$_2$O$_3$.

18. The coated cutting tool of claim 1, wherein Me is Zr.

19. The coated cutting tool of claim 16, wherein Me is Zr.

20. The coated cutting tool of claim 1, wherein the coating is deposited by thermal chemical vapor deposition.

* * * * *